United States Patent [19]
Gordon et al.

[11] Patent Number: 5,869,788
[45] Date of Patent: Feb. 9, 1999

[54] WEIGHING SCALE WITH EMI/RFI SHIELDING

[75] Inventors: Arnold S. Gordon, Woodmere; Mark K. Estes, Baldwin; Roman Andrejko, Rockville Centre, all of N.Y.

[73] Assignee: Circuits and Systems, Inc., East Rockaway, N.Y.

[21] Appl. No.: 862,940

[22] Filed: May 30, 1997

[51] Int. Cl.⁶ .......................... G01G 23/02; G01G 21/28; H05K 9/00
[52] U.S. Cl. ................... 177/124; 177/180; 174/35 R; 174/35 GC; 361/816; 361/818
[58] Field of Search .............. 174/35 R, 35 GC; 361/816, 818; 177/124, 180, 210 R, 238

[56] References Cited

U.S. PATENT DOCUMENTS

| | | | |
|---|---|---|---|
| 3,444,943 | 5/1969 | Tytus | 177/238 |
| 4,526,246 | 7/1985 | Patorary | 177/180 |
| 4,878,552 | 11/1989 | Gebo et al. | 177/262 |
| 4,884,645 | 12/1989 | Knothe et al. | 177/180 |
| 5,473,110 | 12/1995 | Johnson | 174/35 GC |
| 5,481,071 | 1/1996 | Wojnarski | 177/124 |
| 5,521,334 | 5/1996 | Freeman | 177/154 |
| 5,524,908 | 6/1996 | Reis | 174/35 GC |
| 5,527,989 | 6/1996 | Leeb | 361/818 |
| 5,723,826 | 3/1998 | Kitagawa et al. | 177/211 |

Primary Examiner—Randy W. Gibson
Attorney, Agent, or Firm—David P. Gordon; David S. Jacobson; Thomas A. Gallagher

[57] ABSTRACT

An electronic weighing device includes a lower electrically conductive plate, an upper electrically conductive plate, a load cell coupled to central portions of the upper and lower plates such that the load cell responds to weight on the upper plate, and a flexible, conductive band coupling the periphery of the upper plate to the periphery of the lower plate. An electronic circuit is coupled to the load cell. The circuit is provided on a board which is mounted on the lower plate close to its center. A pair of bores are provided in the lower plate extending from the circuit board to an edge of the lower plate. A pair of non-conductive rods are coupled to potentiometer on the circuit board. The non-conductive rods extend through the bores from the circuit board to the peripheral edge of the lower plate. The lower plate is provided with a shielded electrical socket which is coupled by shielded cable to the circuit board. A conductive cover is provided over the upper plate, the load cell, and the band. The weighing device provides a conductive envelope which substantially encloses the load cell and associated circuitry. Preferably the band is formed with metallic cloth tape which is applied to the edges of the upper and lower plates in a sideways-Ω-shaped configuration. The band does not interfere with the movement of the plates, yet provides an RF/EM shield around the space between the plates.

18 Claims, 3 Drawing Sheets

WEIGHING SCALE WITH EMI/RFI SHIELDING

BACKGROUND OF THE INVENTION

1. Field of the Invention

The invention relates to electronic weighing devices. More particularly, the invention relates to an electronic weighing device which is shielded to prevent EMI/RFI emission and to provide EMI/RFI immunity.

2. State of the Art

Electronic weighing devices are widely known in the art and there are many different technologies utilized in these electronic weighing devices. Generally, the electronic weighing technologies utilize a transducer of some type which generates an electrical signal which is proportional to the weight being measured. Most electronic weighing devices use load cell technology. In load cell scales, the applied weight compresses an elastic member which has strain gauges bonded to its surface. The strain gauge is a fine wire or etched foil which undergoes a change in electrical resistance when it is either stretched or compressed. A measurement of this change in resistance yields a measure of the applied weight. Regardless of the technology used, all electronic scales rely on some type of circuit to convert the electrical signal generated by the transducer to a signal which can be used to operated a weight display.

All electronic circuits generate a certain amount of electromagnetic (EM) radiation or radio frequency (RF) radiation and all electronic devices can be adversely affected by this type of radiation. Undesirable radiation of this type is referred to as noise or interference. Thus, the terms EMI and RFI refer to electromagnetic interference and radio frequency interference. EMI and RFI can be classified in three categories: atmospheric noise, galactic noise, and man-made noise. Atmospheric noise is generally the result of thunderstorms and lightening discharges. Sensitive electronic equipment can be affected by a thunderstorm more than one thousand miles away. Galactic noise which reaches earth is primarily the result of solar activity such as sun spots and sun flares. Solar storms can severely affect sensitive electronic equipment. The most preponderant source of EMI and RFI, however, is man-made noise. Every electrical device, including a simple light bulb, is capable of generating a certain amount of noise. Given the ever increasing proliferation of electrical devices throughout the world, man-made EMI and RFI has now been recognized as a serious environmental problem which can adversely affect the operation of all electronic devices.

Society now relies greatly on the accurate function of electronic devices. A malfunction in an electronic device can result in economic loss, can cause a health hazard, or can damage property. For this reason, various industrial standards committees and governmental agencies have adopted specifications for permissible levels of EMI and RFI. These specifications apply to many different electronic devices and provide for EMI and RFI emissions as well as immunity. The emissions specification indicates the maximum permissible amount of interference an electrical device may generate and the immunity specification indicates the amount of ambient interference that an electrical device must tolerate while continuing to function accurately.

There are many situations in which electronic weighing devices should or must comply with EMI and RFI emissions and immunity specifications. Generally, whenever an electronic weighing device is used in the vicinity of other electrical equipment, the emissions and immunity specifications should apply. In some of these situations, interference generated by the electronic weighing device can cause nearby devices to malfunction. For example, in a laboratory where many sensitive electronic devices may be near an electronic weighing device, emissions from the electronic weighing device must be controlled. In other situations, interference generated by nearby devices can cause an electronic weighing device to become unreliable. For example, there are situations where an electronic weighing device is used to constantly monitor the contents of a liquid or gas cylinder. The output of the weighing device is used to determine when the cylinder is near empty, or to determine the rate at which the liquid or gas is dispensed. Ambient RF or EM interference can cause errors in these determinations. Such errors can be costly and/or hazardous. Electronic weighing devices are commonly used in the semiconductor manufacturing industry to monitor gases used in the manufacturing process. An error in monitoring these gases can result in damage to many thousands of dollars worth of semiconductors. Moreover, electronic weighing devices can be used to monitor liquids and gases used in medicine or in environmental control. An error in monitoring these fluids can be hazardous or fatal.

Shielding an electronic weighing device for RFI and EMI is challenging. The weighing devices have moving parts which must not be inhibited and the circuits used in the weighing devices must be accessible to adjust the zero setting and sensitivity of the electronic weighing device.

SUMMARY OF THE INVENTION

It is therefore an object of the invention to provide an electronic weighing device which is shielded to prevent EMI/RFI emission and to provide EMI/RFI immunity.

It is also an object of the invention to provide an electronic weighing device with EMI/RFI shielding which does not interfere with moving parts of the electronic weighing device.

It is another object of the invention to provide an electronic weighing device with EMI/RFI shielding which does not interfere with access to the circuits used in the electronic weighing device.

It is a further object of the invention to provide an electronic weighing device with EMI/RFI shielding which is easy to manufacture.

In accord with these objects which will be discussed in detail below, the electronic weighing device of the present invention includes a lower electrically conductive base plate, an upper electrically conductive load bearing plate, a load cell coupled to central portions of the upper and lower plates such that the load cell responds to weight on the bearing plate, and a flexible conductive band coupling the periphery of the upper plate to the periphery of the lower plate. An electronic circuit is electrically coupled to the load cell. The circuit is provided on a board which is mechanically mounted on the lower plate close to its center. A pair of grooves or bores are provided in the lower plate extending from the circuit board to a peripheral edge of the lower plate. A pair of non-conductive rods are coupled to adjustment potentiometers on the circuit board. The non-conductive rods extend through the grooves or bores from the circuit board to the peripheral edge of the lower plate. A peripheral portion of the lower plate is provided with a shielded electrical socket which is coupled by shielded cable to the circuit on the circuit board.

As provided, the electronic weighing device according to the invention therefore constitutes a conductive envelope which substantially completely encloses the load cell and associated circuitry. The conductive band is preferably a rolling band which does not interfere with the movement of the upper plate relative to the lower plate, yet provides an RF/EM shield around the space between the plates. The bores (or grooves) and the non-conductive rods allow access to circuit adjustments without significantly affecting the integrity of the shielding. Locating the load cells and the circuit close to the centers of the plates minimizes the impact of the bores (or grooves) on the integrity of the shielding.

According to a presently preferred aspect of the invention, the conductive rolling band is formed with metallic cloth tape which is applied to the outer edges of the upper and lower plates in an sideways-Ω-shaped configuration. In addition, an electrically conductive cover is preferably provided and attached to the top surface of the top plate with four sides extending down adjacent to the rolling band. The cover is preferably electrically coupled to the top plate with a conductive adhesive and forms an additional RF/EM shield around the space between the plates.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 1:
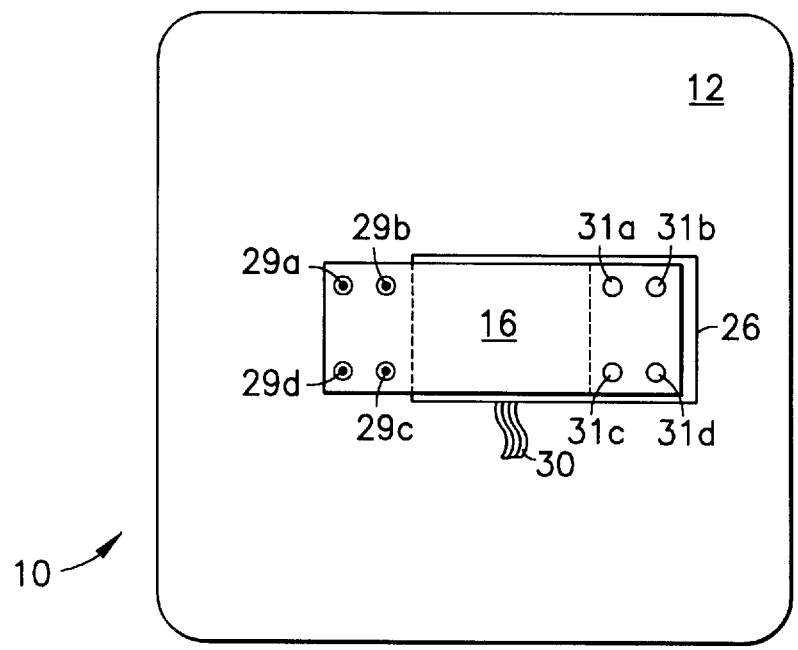
FIG. 1 is a plan view of the underside of a bearing plate of a weighing device according to the invention.
Figure 2:
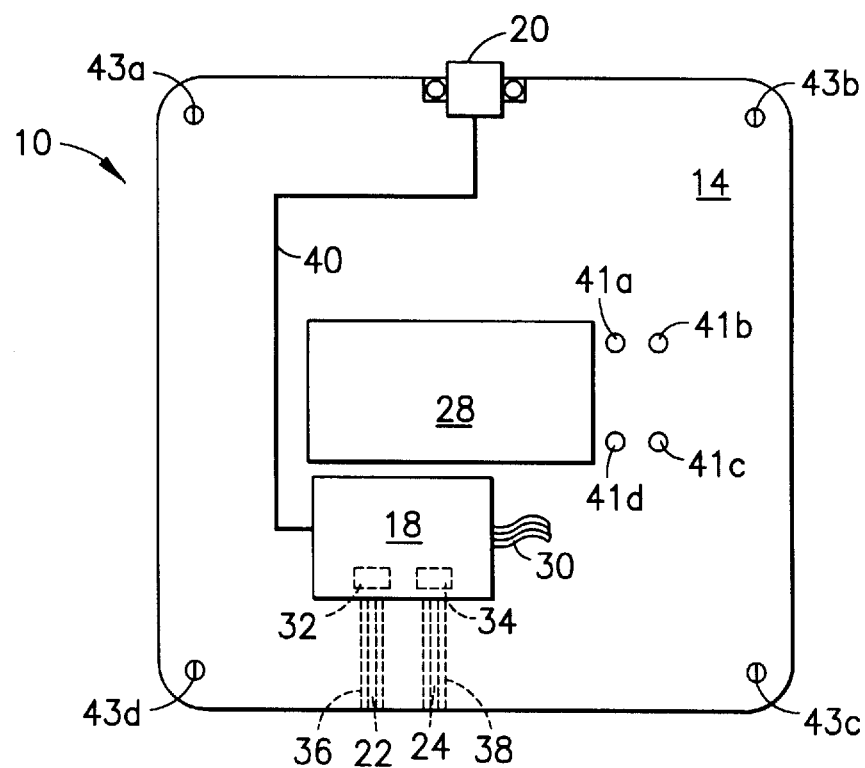
FIG. 2 is a plan view of the top side of a base plate of a weighing device according to the invention.

Referring now to FIGS. 1 and 2, an electronic weighing device 10 includes an upper electrically conductive load bearing plate 12, a lower electrically conductive base plate 14, a load cell 16, a circuit board 18, a shielded socket 20, and two plastic rods 22, 24. The upper load bearing plate 12 is provided with a centrally located rectangular recess 26 for receiving an upper portion of the load cell 16 and the lower base plate 14 is provided with a similar recess 28 for receiving a lower portion of the load cell 16. The load cell 16 is mechanically coupled to the upper plate 12 by four hex head screws 29a–29d which engage four threaded holes, two of which (33c, 33d) are shown in FIG. 4, which are located on one side of the recess 26. The load cell 16 is electrically coupled to the circuit board 18 by a flexible cable 30. The load cell 16 is also provided with four threaded holes 31a–31d for mechanically coupling it to the base plate 14 as described in more detail below with reference to FIGS. 3 and 4.

The circuit board 18 is mounted to the lower base plate 14 adjacent to the lower recess 28 by screws (not shown). The circuit board includes two adjustment potentiometers 32, 34 which provide a zeroing and span functions and the plate 14 is provided with a recess (not shown) for receiving the potentiometers 32, 34 below the upper surface of the plate 14. A pair of throughbores (or grooves) 36, 38 are provided in the base plate 14 and extend from the location of the potentiometer 32, 34 to the outer periphery of the plate 14. The plastic rods 22, 24 are placed in the throughbores (or grooves) 36, 38 and engage the potentiometers 32, 34 thereby providing mechanical access to the potentiometers from the outer edge of the base plate 14. The shielded socket 20 is mounted adjacent to an edge of the base plate 14 and is coupled to the circuit board 18 by a shielded cable 40 thereby providing electrical access to the circuit board 18 from the outer edge of the base plate 14. The baseplate 14 is also provided with four holes 41a–41d located adjacent to one side of the recess 28 for coupling the load cell 15 to the base plate 14 as described in more detail below with reference to FIGS. 3 and 4. According to a presently preferred embodiment, the baseplate 14 is provided with four upstanding corner stops 43a–43d for limiting movement of the bearing plate relative to the base plate as described in more detail below with reference to FIGS. 3 and 4.

According to an exemplary embodiment of the invention, the upper and lower plates are made from aluminum and measure approximately nine inches square by one half inch thick. The load cell 16 is approximately two inches by five inches by approximately one inch at its tallest portion, and has a Z-shaped profile. The recesses 26, 28 are approximately two inches by four inches and one quarter inch deep.

Figure 3:
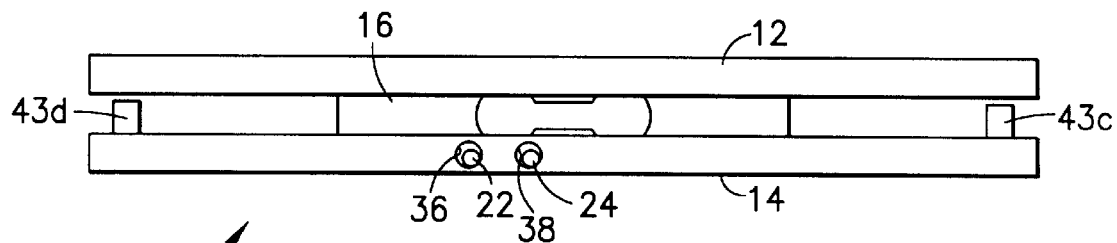
FIG. 3 is a side elevation view of a partially assembled weighing device according to the invention.
Figure 4:
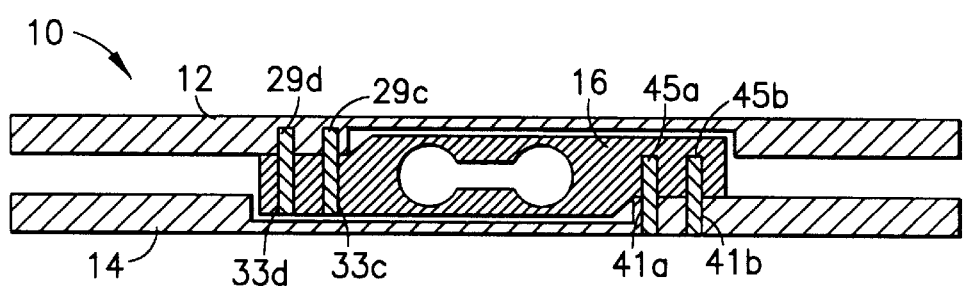
FIG. 4 is a medial sectional view of the partially assembled device.

Turning now to FIGS. 3 and 4, and with reference to FIGS. 1 and 2, the lower base plate 14 is coupled to the load cell 16 by four screws, two of which (45a, 45b) are shown in FIG. 4, which pass through the holes 41a–41d in the base plate 14. As previously described, the upper plate 12 is coupled to the load cell 16 by four screws, two of which (29c, 29d) are shown in FIG. 4. When the plates are so coupled to the load cell, the plates 12, 14 assume a substantially parallel alignment as seen best in FIGS. 3 and 4.

Figure 5:
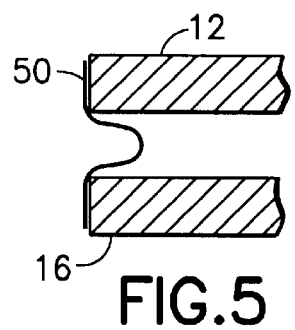
FIG. 5 is sectional view illustrating the rolling band of the invention.

Referring to FIG. 5, and according to a presently preferred aspect of the invention, a metallic cloth tape is applied to the outer edges of the upper and lower plates 12, 14 to form a flexible rolling band 50. This conductive rolling band, together with plates 12 and 14, creates an RF/EM shield around the load cell 16 and the circuit board 18. The band 50 is preferably formed in a non-structurally-supporting configuration such that the band does not inhibit movement of the upper and lower plates 12, 14 relative to each other. A sideways-Ω-shaped configuration is preferred for the band.

Figure 8:
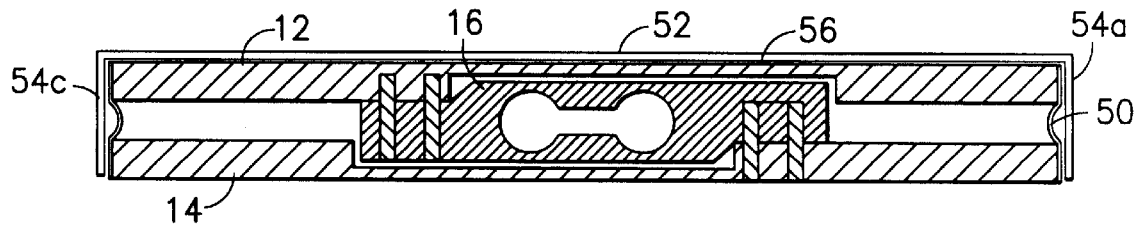
FIG. 8 is a cross-section through line 8—8 in FIG. 7.
Figure 6:
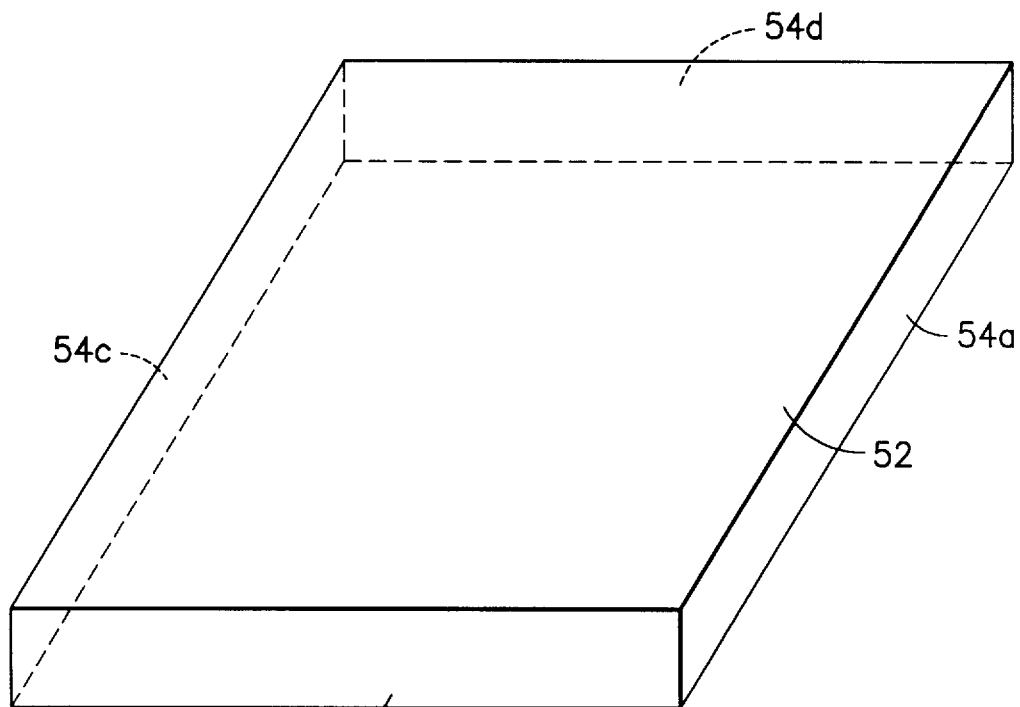
FIG. 6 is a perspective view of the conductive cover of the invention.
Figure 7:
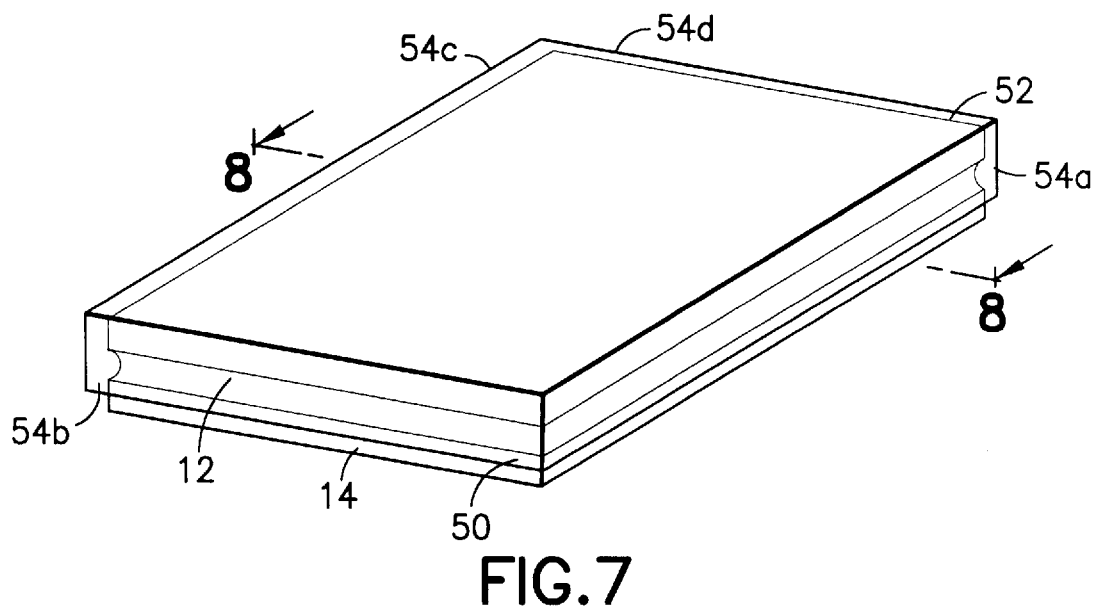
FIG. 7 is a partially transparent perspective view of a fully assembled weighing device according to the invention.

Turning to FIGS. 6 through 8, an electrically conductive cover 52 is preferably attached to the top surface of the top plate 12. Four sides 54a–d of the cover 52 extend down adjacent to the band 50. The cover 52 is preferably electrically coupled to the top plate 12 with an electrically conductive transfer tape 56 or other electrically conductive adhesive, or other means, and forms an additional RF/EM shield around the space between the plates.

There have been described and illustrated herein an electronic weighing apparatus with EMI/RFI shielding. However, it is not intended that the invention be limited to the particular description of the invention, as it is intended that the invention be as broad in scope as the art will allow and that the specification be read likewise. Thus, while particular couplings of the load cell to the upper bearing and lower base plates have been disclosed, it will be appreciated that other couplings could be utilized. Also, while corner stops are shown for limiting movement of the bearing plate relative to the base plate, it will be recognized that other structure may be provided for limiting such movement. Moreover, while a particular Ω-shaped configuration has been disclosed for the band, it will be appreciated that other configurations could be used as well. For example, the band may be S-shaped, pleated or provided with accordion-like folds between the upper and lower plates. Further, while the band was described as being formed from metallic cloth tape, other conductive flexible means could be utilized such as a thin metal or foil, or a synthetic material coated or imbedded with a conductive metal. Furthermore, while a conductive adhesive is preferred for coupling the cover to the bearing plate, it will be understood that another electrical coupling can achieve the same or similar function as disclosed herein, and that the cover, while desirable, is not absolutely necessary for shielding the circuit board and load cell. Also, while certain materials and dimensions are described in the exemplary description, it will be appreciated that other materials and dimensions may be utilized. It will therefore be appreciated by those skilled in the art that yet other modifications could be made to the provided invention without deviating from its spirit and scope as so claimed.

We claim:

1. An electronic weighing device, comprises:
   a) an electrically conductive lower base plate having a first periphery;
   b) an electrically conductive upper load bearing plate having a second periphery;
   c) a load cell coupled to said upper and lower plates and adapted to respond to weight on said upper plate; and
   d) a conductive flexible band electrically coupling said second periphery of said upper plate to said first periphery of said lower plate, such that said lower plate, said upper plate, and said conductive band substantially completely enclose said load cell to form a conductive envelope around said load cell.

2. An electronic weighing device according to claim 1, wherein:
   said band is formed of a metallic cloth tape.

3. An electronic weighing device according to claim 1, wherein:
   said conductive band is applied to said upper and lower plates in a non-structurally-supporting configuration.

4. An electronic weighing device according to claim 1, further comprising:
   e) an electronic circuit electrically coupled to said load cell, said electronic circuit being contained within said conductive envelope.

5. An electronic weighing device according to claim 4, wherein:
   said electronic circuit is provided on a circuit board.

6. An electronic weighing device according to claim 5, wherein:
   said circuit board is mechanically mounted on said lower plate close to a center of said lower plate.

7. An electronic weighing device according to claim 5, further comprising:

f) a shielded electrical socket provided at a peripheral portion of said lower plate and coupled to said circuit board by a shielded cable.

8. An electronic weighing device according to claim 4, further comprising:
   f) a non-conductive rod,
      wherein said electronic circuit includes a potentiometer, and said lower plate is provided with one of an elongate groove and an elongate bore extending from said potentiometer to said first periphery, said non-conductive rod being coupled to said potentiometer and extending through said one of said groove and said bore to said first periphery.

9. An electronic weighing device according to claim 1, wherein:
   said load cell is coupled to a central portion of said upper plate and a central portion of said lower plate.

10. An electronic weighing device according to claim 1, further comprising:
    e) an electrically conductive cover positioned over said upper plate, said load cell, and said conductive band.

11. An electronic weighing device according to claim 10, wherein:
    said conductive cover is coupled to said upper plate with an electrically conductive adhesive.

12. An electronic weighing device, comprises:
    a) a lower base plate having an elongate first periphery and one of a groove and an elongate bore;
    b) an upper load bearing plate;
    c) a load cell coupled to said upper and lower plates and adapted to respond to weight on said upper plate;
    d) an electronic circuit coupled to said load cell and including a potentiometer; and
    e) a non-conductive rod coupled to said potentiometer and extending through said one of said groove and said bore to said first periphery.

13. An electronic weighing device, according to claim 12, further comprising:
    f) a flexible band coupled around said first periphery of said lower base plate and around a second periphery of said upper load bearing plate, wherein
       said lower base plate, said upper load bearing plate, and said flexible band are all conductive and form a conductive envelope about said load cell.

14. An electronic weighing device according to claim 13, wherein:
    said flexible band is a metallic cloth tape.

15. An electronic weighing device according to claim 14, wherein:
    said metallic cloth tape is shaped with a loop.

16. An electronic weighing device according to claim 15, wherein:
    said loop is substantially Ω-shaped.

17. An electronic weighing device according to claim 2, wherein:
    said metallic cloth tape is shaped with a loop.

18. An electronic weighing device according to claim 17, wherein:
    said loop is substantially Ω-shaped.

* * * * *